US009973213B2

(12) United States Patent
Hsiao et al.

(10) Patent No.: US 9,973,213 B2
(45) Date of Patent: May 15, 2018

(54) DECODING METHOD, AND MEMORY STORAGE APPARATUS AND MEMORY CONTROL CIRCUIT UNIT USING THE SAME

(71) Applicant: EpoStar Electronics Corp., Hsinchu (TW)

(72) Inventors: Yu-Hua Hsiao, Hsinchu County (TW); Heng-Lin Yen, Hsinchu County (TW); Ming-Yu Tsai, Kaohsiung (TW)

(73) Assignee: EpoStar Electronics Corp., Hsinchu (TW)

( * ) Notice: Subject to any disclaimer, the term of this patent is extended or adjusted under 35 U.S.C. 154(b) by 5 days.

(21) Appl. No.: 15/236,487

(22) Filed: Aug. 15, 2016

(65) Prior Publication Data

US 2018/0013445 A1    Jan. 11, 2018

(30) Foreign Application Priority Data

Jul. 5, 2016  (TW) .............................. 105121181 A

(51) Int. Cl.
 *H03M 13/11* (2006.01)
(52) U.S. Cl.
 CPC .... *H03M 13/1128* (2013.01); *H03M 13/1108* (2013.01); *H03M 13/1111* (2013.01)
(58) Field of Classification Search
 CPC ....................... H03M 13/1128; H03M 13/1111
 See application file for complete search history.

(56) References Cited

U.S. PATENT DOCUMENTS

| | | | | |
|---|---|---|---|---|
| 6,697,443 B1* | 2/2004 | Kim | ................... | H03M 13/4107 375/262 |
| 9,184,954 B1* | 11/2015 | Alhussien | ............ | H03M 13/114 |
| 9,270,296 B1* | 2/2016 | Nemati Anaraki | . | G06F 11/1008 |
| 2006/0123318 A1* | 6/2006 | Kim | ................... | H03M 13/1114 714/758 |
| 2007/0089016 A1* | 4/2007 | Bhatt | ................. | H03M 13/1111 714/752 |
| 2008/0250300 A1* | 10/2008 | Mokhlesi | ............ | G11C 11/5642 714/780 |
| 2010/0169734 A1* | 7/2010 | Gamage | ............. | H03M 13/1105 714/752 |

* cited by examiner

*Primary Examiner* — Joseph D Torres
(74) *Attorney, Agent, or Firm* — JCIPRNET

(57) ABSTRACT

A decoding method for low density parity code is provided. The method includes performing an iterative decoding operation for a codeword, wherein a plurality of Log-Likelihood-Ratios correspond respectively to a plurality of data bits of the codeword; determining whether the iterative decoding operation is successful; determining whether a perturbation condition is met if the iterative decoding operation is not successful; performing protect operation for a first Log-Likelihood-Ratio among the Log-Likelihood-Ratios, and performing a perturbation operation for a plurality of second Log-Likelihood-Ratios among the Log-Likelihood-Ratios, wherein the second Log-Likelihood-Ratios are different to the first Log-Likelihood-Ratio; and re-performing the iterative decoding operation for the codeword after finishing the perturbation operation.

21 Claims, 6 Drawing Sheets

DECODING METHOD, AND MEMORY STORAGE APPARATUS AND MEMORY CONTROL CIRCUIT UNIT USING THE SAME

CROSS-REFERENCE TO RELATED APPLICATION

This application claims the priority benefit of Taiwan application serial no. 105121181, filed on Jul. 5, 2016. The entirety of the above-mentioned patent application is hereby incorporated by reference herein and made a part of this specification.

BACKGROUND

Technology Field

The present invention relates to a decoding technique, and particularly, a decoding method about the Low-Density Parity-Check code, a memory storage apparatus and a memory control circuit unit using the same.

Description of Related Art

Along with the widespread of digital cameras, cell phones, and MP3 in recently years, the consumers' demand for storage media has increased drastically. Since a rewritable non-volatile memory is characterized by non-volatility of data, low power consumption, small volume, non-mechanical structure, and fast reading and writing speed, the rewritable non-volatile memory is the most adaptable memory to be applied in the foregoing portable multimedia device.

Generally, in order to ensure the correctness of data stored in the rewritable non-volatile memory module, the data would be first encoded before being stored into the rewritable non-volatile memory module. The encoded data (including raw data and error correcting code) is stored to the rewritable non-volatile memory module. Going forward, the encoded data can be read from the rewritable non-volatile memory module and be decoded to correct the errors which may be present in the read data. Most conventional error correcting code is using the algebraic algorithms, such as BCH code, but the current probability decoding algorithm, such as low-density parity-check code (also referred to as LDPC code) is gradually mature. Low-density parity-check code is using a sparse matrix to encode and decode.

Low-density parity-check code is first proposed by Gallager in 1960, but after 1960, LDPC code is gradually not the favourite because its implementation is too complex and the technique at that time cannot reduce the complexity of implementation of the LDPC code. However, after 1990, the LDPC code was re-studied, and has been confirmed that if the LDPC code is used for performing an iterative decoding based on the corresponding Tanner graph and sum-product algorithm (SPA), the performance level would achieve near the Shannon limit by performing the decoding operation with the LDPC code.

LDPC codes are typically defined as a parity-check matrix, and it can be expressed by using the bipartite graph, wherein the bipartite graph is related to the foregoing Tanner graph. The bipartite graph is a graph constructed by a plurality of nodes, and those nodes will be divided into two different types, and LDPC code can be presented by the bipartite graph constructed by nodes. One part of the nodes is called variable nodes, while another is called check nodes.

Each of the nodes is respectively mapped to each of the encoded data bits (also referred to as codeword) one by one. Variable nodes are also called as message nodes or bits nodes. Check nodes are also called as parity nodes.

In general, a LDPC decoder in an iterative decoding operation performs the decoding by information of unsatisfied check node or Log-Likelihood Ratio (LLR).

However, regarding the bit error rate, the iterative decoding operation still encounters problems, such as high reliability error, matrix trapping set, a local maximum or a local minimum, etc. These problems would lead to an error floor region of the bit error rate and a decrement of the speed of the decoding converging. Therefore, how to detect and solve the divergent Log-Likelihood Ratio, as to enhance the performance of LDPC decoder, is the subject of interest for the person in the art.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

A decoding method for the Low-density parity-check decoder is provided. The method may determine whether a perturbation condition is met if an iterative decoding operation is not successful, as to protect specific log-likelihood ratio, and perform a perturbation operation for other Log-Likelihood Ratio not being protected such that the decoding performance would be enhanced.

An exemplary embodiment of the present invention provides a decoding method for a low-density parity-check decoder. The method includes performing an iterative decoding operation for a codeword, wherein a plurality of Log-Likelihood Ratios (LLRs) respectively correspond a plurality of data bit values of the codeword; determining whether the iterative decoding operation is successful; if the iterative decoding operation is not successful, determining whether a perturbation condition is met; if the perturbation condition is met, performing a protect operation for a first Log-Likelihood Ratio among the Log-Likelihood Ratios, and performing a perturbation operation for a plurality of second Log-Likelihood Ratios among the Log-Likelihood Ratios, wherein the second Log-Likelihood Ratios are different to the first Log-Likelihood Ratio; performing the iterative decoding operation for the codeword again after finishing the perturbation operation.

An exemplary embodiment of the present invention provides a memory storage apparatus, and the apparatus includes a connection interface unit, a rewritable non-volatile memory module, and a memory control circuit unit. The connection interface unit is configured to couple to a host system. The memory control circuit unit is coupled to the connection interface unit and the rewritable non-volatile memory module, wherein the memory control circuit unit is configured to perform an iterative decoding operation for a codeword for decoding data stored in the rewritable non-volatile memory module, wherein the codeword corresponds the data, wherein a plurality of Log-Likelihood Ratios respectively correspond a plurality of data bit values of the codeword, wherein the memory control circuit unit is further configured to determine whether the iterative decoding operation is successful, wherein the memory control circuit unit is further configured to determine whether a perturbation condition is met if the iterative decoding operation is not successful, wherein, if the perturbation condition is met, the memory control circuit unit is further configured to perform a protect operation for a first Log-Likelihood Ratio among the Log-Likelihood Ratios, and perform a perturbation operation for a plurality of second Log-Likelihood Ratios among the Log-Likelihood Ratios, wherein the second Log-Likelihood Ratios are different to the first Log-Likelihood Ratio, wherein the memory control circuit unit is further configured to perform the iterative decoding operation for the codeword again after finishing the perturbation operation.

An exemplary embodiment of the present invention provides a memory control circuit unit for controlling a rewritable non-volatile memory module. The memory control circuit includes a host interface, a memory interface, an error checking and correcting circuit and a memory management circuit. The host interface is configured to couple to a host system. The memory interface is configured to couple to the rewritable non-volatile memory module. The memory management circuit is coupled to the host interface, the memory interface and the error checking and correcting circuit, wherein the memory management circuit sends a codeword to the error checking and correcting circuit, wherein the error checking and correcting circuit is configured to perform an iterative decoding operation for a codeword for decoding data stored in the rewritable non-volatile memory module, wherein the codeword corresponds the data, wherein a plurality of Log-Likelihood Ratios respectively correspond a plurality of data bit values of the codeword, wherein the error checking and correcting circuit is further configured to determine whether the iterative decoding operation is successful, wherein the error checking and correcting circuit is further configured to determine whether a perturbation condition is met if the iterative decoding operation is not successful; wherein, if the perturbation condition is met, the error checking and correcting circuit is further configured to perform a protect operation for a first Log-Likelihood Ratio among the Log-Likelihood Ratios, and perform a perturbation operation for a plurality of second Log-Likelihood Ratios among the Log-Likelihood Ratios, wherein the second Log-Likelihood Ratios are different to the first log-likelihood ratio, wherein the error checking and correcting circuit is further configured to perform the iterative decoding operation for the codeword again after finishing the perturbation operation.

Based on the above, the decoding method provided by the exemplary embodiments of the present invention are capable of performing a protect operation for specific Log-Likelihood Ratio adaptively when a perturbation condition is met, and performing a perturbation operation for the other Log-Likelihood Ratios, to avoid a problem of a syndrome/Log-Likelihood Ratio cannot be converged in the iterative decoding operation, and to strengthen the chances of successfully decoding such that the decoding efficiency and work efficiency are enhanced.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF EMBODIMENTS

Figure 1:
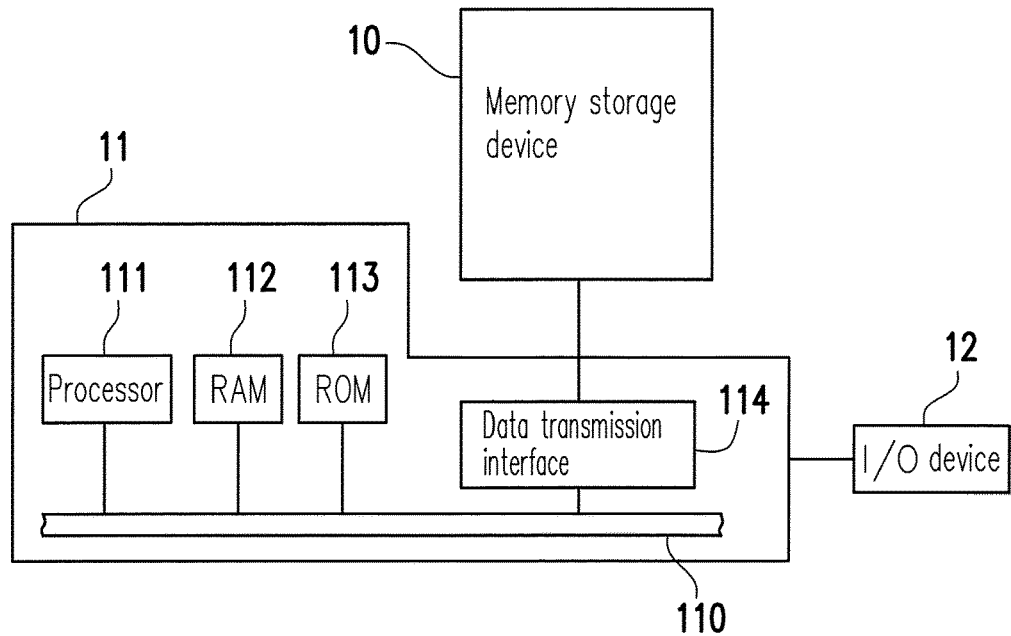
FIG. 1 is a schematic diagram illustrating a host system, a memory storage apparatus and an I/O device according to an exemplary embodiment of the present invention.

Reference will now be made in detail to the present preferred embodiments of the present invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, the memory storage apparatus (also referred to as memory storage system) includes a rewritable non-volatile memory module and a controller (also referred to as a control circuit). Typically, the memory storage apparatus is generally used together with a host system, so that the host system may write data to the memory storage apparatus or read data from the memory storage apparatus.

Figure 2:
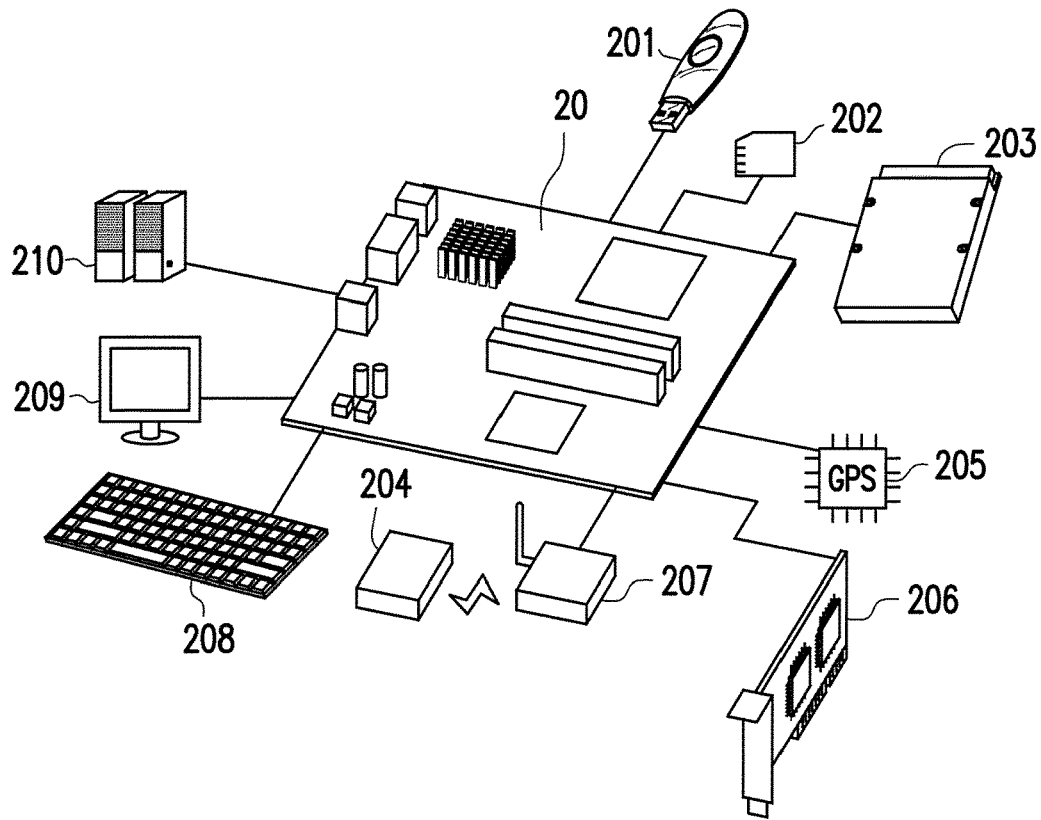
FIG. 2 is a schematic diagram illustrating a host system, a memory storage apparatus and a I/O device according to another exemplary embodiment of the present invention.

FIG. 1 is a schematic diagram illustrating a host system, a memory storage apparatus and an I/O device according to an exemplary embodiment of the present invention. FIG. 2 is a schematic diagram illustrating a host system, a memory storage apparatus and a I/O device according to another exemplary embodiment of the present invention.

Referring to FIG. 1 and FIG. 2, the host system 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage apparatus 10 through the data transmission interface 114. For example, the host system 11 may store data into the memory storage apparatus 10 or read data from the memory storage apparatus 10 through the data transmission interface 114. Moreover, the host system 11 is coupled to the I/O device 12 through the system bus 110. For example, the host system 11 may transmit an output signal to the I/O device 12 or receive an input signal from the I/O device 12 through the system bus 110.

In the present exemplary embodiment, the processor 111, the RAM 112, the ROM 113 and the data transmission interface 114 can be disposed on a motherboard 20 of the host system 11. The number of the data transmission interface 114 can be one or plural. The motherboard 20 can be coupled to the memory storage apparatus 10 in a wired or wireless manner through the data transmission interface 114. The memory storage apparatus 10 is, for example, a flash drive 201, a memory card 202, a solid state driver (SSD) 203 or a wireless memory storage apparatus 204. The wireless memory storage apparatus 204 is, for example, a memory storage apparatus based on a wireless communication technique, such as a near field communication (NFC) memory storage apparatus, a wireless fidelity (WiFi) memory storage apparatus, a bluetooth memory storage apparatus or a low power bluetooth memory storage apparatus (for example, iBeacon), etc. Moreover, the motherboard 20 can also be coupled to various I/O devices such as a global positioning system (GPS) module 205, a network interface card 206, a wireless transmission device 207, a keyboard 208, a screen 209, a speaker 210, etc., through the system bus 110. For example, in an exemplary embodiment, the motherboard 20 may access the wireless memory storage apparatus 204 through the wireless transmission device 207.

Figure 3:
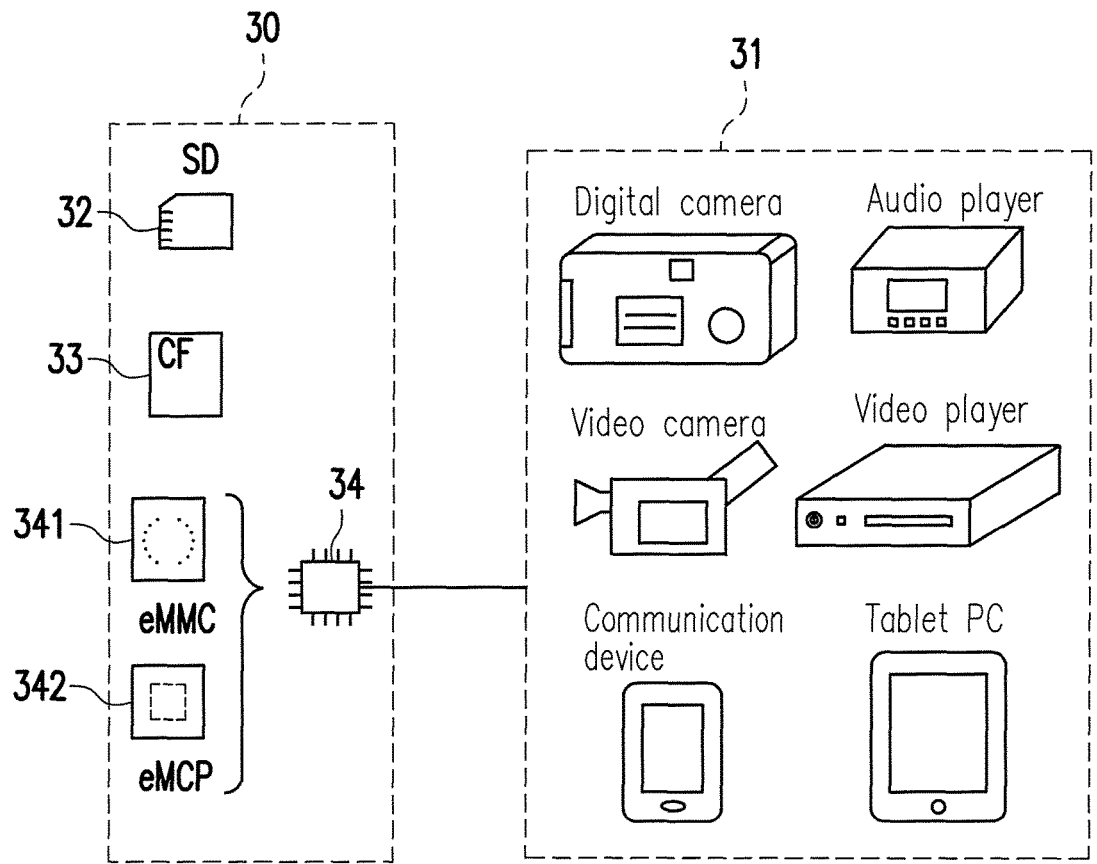
FIG. 3 is a schematic diagram illustrating a host system and a memory storage apparatus according to another exemplary embodiment of the present invention.

In an exemplary embodiment, the aforementioned host system can be any system substantially cooperated with the memory storage apparatus to store data. In the aforementioned exemplary embodiment, the host system implemented by a computer system is taken as an example for description, however, FIG. 3 is a schematic diagram illustrating a host system and a memory storage apparatus according to another exemplary embodiment of the present invention. Referring to FIG. 3, in another exemplary embodiment, the host system 31 can also be a digital camera, a video camera, a communication device, an audio player, a video player or a tablet PC, etc., and the memory storage apparatus 30 can be a non-volatile memory storage apparatus such as a secure digital (SD) card 32, a compact flash (CF) card 33, or an embedded storage device 34, etc., used by the host system 31. The embedded storage device 34 includes an embedded multimedia card (eMMC) 341 and/or an embedded multi chip package (eMCP) storage device 342, etc., that is formed by directly coupling various memory modules to a substrate of the host system.

Figure 4:
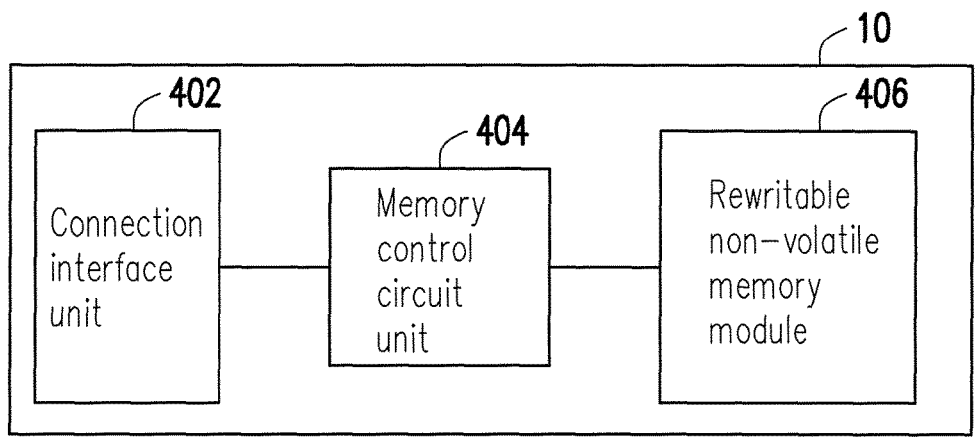
FIG. 4 is a schematic block diagram illustrating the memory storage apparatus according to an exemplary embodiment of the present invention.

FIG. 4 is a schematic block diagram illustrating the memory storage apparatus according to an exemplary embodiment of the present invention.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is complied with a serial advanced technology attachment (SATA) standard. However, it should be noted that the present disclosure is not limited thereto, and the connection interface unit 402 can also be complied with a parallel advanced technology attachment (PATA) standard, an institute of electrical and electronic engineers (IEEE) 1394 standard, a peripheral component interconnect (PCI) express standard, a universal serial bus (USB) standard, an SD interface standard, an ultra high speed-I (UHS-I) interface standard, an ultra high speed-II (UHS-II) interface standard, a memory stick (MS) interface standard, a multi-chip package interface standard, a multimedia card (MMC) interface standard, an eMMC interface standard, a universal flash storage (UFS) interface standard, an eMCP interface standard, a CF interface standard, an integrated device electronics (IDE) standard or other suitable standards. The connection interface unit 402 and the memory control circuit unit 404 can be packaged in one chip, or the connection interface unit 402 is configured outside a chip containing the memory control circuit unit 404.

The memory control circuit unit 404 may execute a plurality of logic gates or control instructions implemented in a hardware form or a firmware form, and may perform a writing operation, a reading operation or an erasing operation on the rewritable non-volatile memory module 406 according to commands of the host system 11.

The rewritable non-volatile memory module 406 is coupled to the memory control circuit unit 404 and is used for storing data written by the host system 11. The rewritable non-volatile memory module 406 can be a single level cell (SLC) NAND flash memory module (i.e. a flash memory module with one memory cell storing data of one bit), a multi level cell (MLC) NAND flash memory module (i.e. a flash memory module with one memory cell storing data of two bits), a triple level cell (TLC) NAND flash memory module (i.e. a flash memory module with one memory cell storing data of three bits), other flash memory modules or other memory modules having the same characteristic. The memory cells in the rewritable non-volatile memory module 406 are disposed trough a manner of array.

Figure 5:
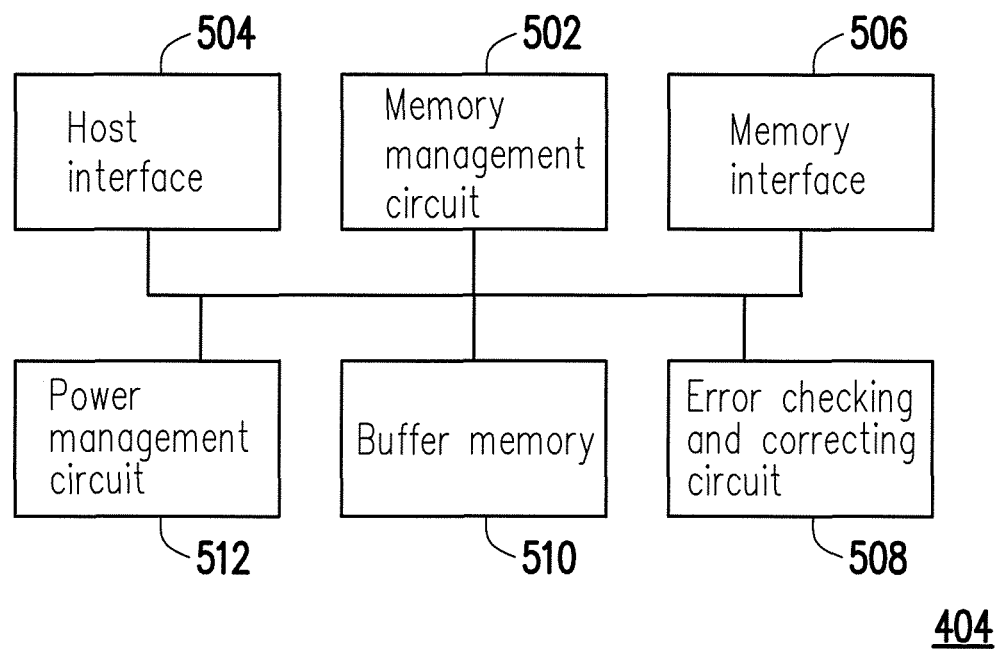
FIG. 5 is a schematic block diagram illustrating the memory control circuit unit according to an exemplary embodiment of the present invention.

FIG. 5 is a schematic block diagram illustrating the memory control circuit unit according to an exemplary embodiment of the present invention.

Referring to FIG. 5, the memory control circuit unit 404 includes a memory management circuit 502, a host interface 504, a memory interface 506 and an error checking and correcting circuit 508.

The memory management circuit 502 is configured to control a whole operation of the memory control circuit unit 404. To be specific, the memory management circuit 502 has a plurality of control instructions, and when the memory storage apparatus 10 operates, these control instructions are executed to implement data writing, reading, erasing operations, etc. Following description of the operations of the memory management circuit 502 is equivalent to description of the operations of the memory control circuit unit 404.

In the present exemplary embodiment, the control instructions of the memory management circuit 502 are implemented in a firmware form. For example, the memory management circuit 502 has a micro processing unit (not shown) and a read-only memory (not shown), and these control instructions are burned in the read-only memory.

When the memory storage apparatus 10 operates, these control instructions are executed by the micro processing unit to implement the data writing, reading, erasing operations, etc.

In another exemplary embodiment, the control instructions of the memory management circuit 502 may also be stored in a specific area (for example, a system area used for storing system data in the memory module) of the rewritable non-volatile memory module 406 as program codes. Moreover, the memory management circuit 502 has a micro processing unit (not shown), a read-only memory (not shown) and a random access memory (RAM) (not shown). Particularly, the read-only memory has a boot code, and when the memory control circuit unit 404 is enabled, the micro processing unit first runs the boot code to load the control instructions stored in the rewritable non-volatile memory module 406 to the RAM of the memory management circuit 502. Then, the micro processing unit executes these control instructions to implement the data writing, reading, erasing operations, etc.

Moreover, in another exemplary embodiment, the control instructions of the memory management circuit 502 may also be implemented in a hardware form. For example, the memory management circuit 502 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are all coupled to the micro controller. The memory cell management circuit is used for managing memory cells of the rewritable non-volatile memory module 406 or groups thereof. The memory writing circuit is used for sending a writing command sequence to the rewritable non-volatile memory module 406 to write data into the rewritable non-volatile memory module 406. The memory reading circuit is used for sending a reading command sequence to the rewritable non-volatile memory module 406 to read data from the rewritable non-volatile memory module 406. The memory erasing circuit is used for sending an erasing command sequence to the rewritable non-volatile memory module 406 to erase data in the rewritable non-volatile memory module 406. The data processing circuit is used for processing data to be written into the rewritable non-volatile memory module 406 and data read from the rewritable non-volatile memory module 406. The writing command sequence, the reading command sequence and the erasing command sequence may respectively include one or a plurality of program codes or command codes and are used for instructing the rewritable non-volatile memory module 406 to execute the corresponding writing, reading, erasing operations, etc. In an exemplary embodiment, the memory management circuit 502 may further send other types of command sequences to the rewritable non-volatile memory module 406 to execute corresponding operations.

The host interface 504 is coupled to the memory management circuit 502 and is configured to receive and recognize commands and data transmitted by the host system 11. Namely, the commands and data transmitted by the host system 11 are transmitted to the memory management circuit 502 through the host interface 504. In the present exemplary embodiment, the host interface 504 is complied with the SATA standard. However, the present disclosure is not limited thereto, and the host interface 604 can also be complied with the PATA standard, the IEEE 1394 standard, the PCI express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 506 is coupled to the memory management circuit 502 and is configured to access the rewritable non-volatile memory module 406. Namely, data to be written into the rewritable non-volatile memory module 406 is converted into a format that can be accepted by the rewritable non-volatile memory module 406 through the memory interface 506. To be specific, when the memory management circuit 502 accesses the rewritable non-volatile memory module 406, the memory interface 506 sends corresponding command sequences. For example, the command sequences may include a writing command sequence indicating to write data, a reading command sequence indicating to read data, an erasing command sequence indicating to erase data, and corresponding command sequences indicating various memory operations (for example, to change a reading voltage level or execute a garbage collection procedure, etc.). These command sequences are, for example, generated by the memory management circuit 502, and are transmitted to the rewritable non-volatile memory module 406 through the memory interface 506. These command sequences may include one or a plurality of signals, or data on the bus. The signals or data may include command codes or program codes. For example, the reading command sequence may include info illation of an identification code, a memory address, etc. for reading.

In an exemplary embodiment, the memory control circuit unit 404 further includes a buffer memory 510 and a power management circuit 512.

The buffer memory 510 is coupled to the memory management circuit 502 and is used for temporarily storing data and commands from the host system 11, or data from the rewritable non-volatile memory module 406. The power management circuit 512 is coupled to the memory management circuit 502 and is used for controlling the power of the memory storage apparatus 10.

In the present exemplary embodiment, the memory cells of the rewritable non-volatile memory module 406 construct a plurality of physical programming units, and the physical programming units construct a plurality of physical erasing unit. To be specific, the memory cells on a same word line (or a same word line layer) consist one or a plurality of physical programming units.

In an exemplary embodiment, if each memory cell is configured to store two bits, the physical programming units on the same word line (or the same word line layer) can be categorized into one lower physical programming unit and one upper physical programming unit. For example, a least significant bit (LSB) of one memory cell belongs to the lower physical programming unit, and a most significant bit (MSB) of one memory cell belongs to the upper physical programming unit. Generally, a writing speed of the lower physical programming unit is greater than that of the upper physical programming unit, and/or reliability of the lower physical programming unit is higher than that of the upper physical programming unit.

In another exemplary embodiment, if each memory cell is configured to store three bits, the physical programming units on the same word line (or the same word line layer) can be categorized into one lower physical programming unit, one upper physical programming unit and one extra physical programming unit. For example, an LSB of one memory cell belongs to the lower physical programming unit, a central significant bit (CSB) of one memory cell belongs to the upper physical programming unit, and an MSB of one memory cell belongs to the extra physical programming unit.

In the present exemplary embodiment, physical programming unit is the smallest unit for programming data. Namely, physical programming unit is the smallest unit for writing data. For example, the physical programming unit is a physical page or a physical sector. If the physical programming unit is physical page, each physical programming unit generally includes a data bit area and a redundant bit area. The data bit area includes a plurality of physical sectors and is configured for storing user data, and the redundant bit area is configured for storing system data (for example, error checking and correcting (ECC) codes). On the other hand, physical erasing unit is the smallest unit for erasing data. Namely, each physical erasing unit contains the least number of memory cells that are erased all together. For example, the physical erasing unit is a physical block.

In an exemplary embodiment, the memory management circuit 502 manages the memory cells of the rewritable non-volatile memory module 406 based on physical units. For example, in the following exemplary embodiment, one physical programming unit is taken as one physical unit. However, in another exemplary embodiment, one physical unit may also refer to one physical erasing unit or may consist of any number of memory cells, which is determined according to an actual requirement. Moreover, it should be noted that when the memory management circuit 502 groups the memory cells (or the physical units) in the rewritable non-volatile memory module 406, the memory cells (or the physical units) are logically grouped, and actual locations thereof are not changed.

In the present exemplary embodiment, the error checking and correcting circuit 508 is coupled to the memory management circuit 502 and is used for executing an error checking and correcting procedure to ensure correctness of data. To be specific, when the memory management circuit 502 receives a writing command from the host system 11, the error checking and correcting circuit 508 generates an error correcting code (ECC) and/or an error detecting code (EDC) for the data corresponding to the writing command, and the memory management circuit 502 writes the data corresponding to the writing command and the corresponding ECC and/or the EDC to the rewritable non-volatile memory module 406. Then, when the memory management circuit 502 reads data from the rewritable non-volatile memory module 406, the ECC and/or the EDC corresponding to the data are simultaneously read, and the error checking and correcting circuit 608 performs the error checking and correcting procedure on the read data according to the ECC and/or the EDC.

In the present exemplary embodiment, the error checking and correcting circuit 508 adopts a Low-Density Parity-Check (LDPC) code. However, in another exemplary embodiment, the error checking and correcting circuit 508 may also adopt a BCH code, a convolution code, a turbo code, a bit flipping encoding/decoding algorithms, etc.

Figure 6:
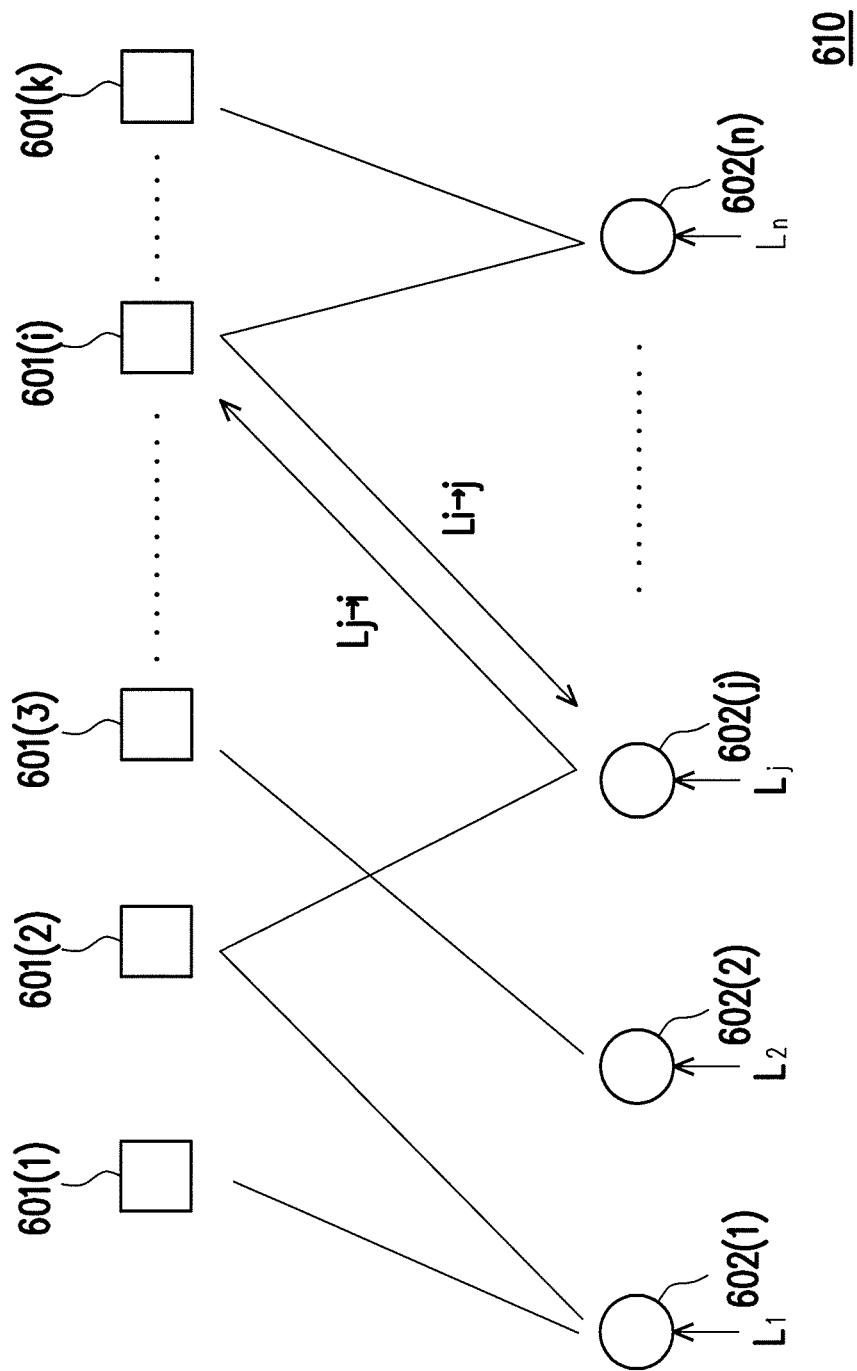
FIG. 6 is a schematic diagram illustrating a belief propagation of the LDPC code according to an exemplary embodiment of the present invention.

FIG. 6 is a schematic diagram illustrating a belief propagation of the LDPC code according to an exemplary embodiment of the present invention.

Referring to FIG. 6, a decoding process of the LDPC code can be represented by a belief propagation graph 610. The belief propagation graph 610 includes check nodes 601(1)-610(k) and variable nodes 602(1)-602(n). Each of the check nodes 601(1)-610(k) corresponds to a syndrome, and each of the variable nodes 602(1)-602(n) corresponds to a data bit in a currently decoded codeword. A corresponding relationship between the data bits and the syndromes (i.e. a connection relationship between the variable nodes 602(1)-602(n) and the check nodes 601(1)-610(k)) is generated according to a parity check matrix adopted by the LDPC code. To be specific, if an element at an $i^{th}$ row and $j^{th}$ column of the parity check matrix is 1, the $i^{th}$ parity node 601(i) is connected to the $j^{th}$ variable node 602(j), where i and j are positive integers.

When the memory management circuit 502 reads n data bits (forming a codeword) from the rewritable non-volatile memory module 406, the memory management circuit 502 (or the error checking and correcting circuit 508) also obtains channel reliability information of each data bit. The channel reliability information represents a probability (or a confidence level) that the corresponding data bit is decoded into bit "1" or "0". For example, in the belief propagation graph 610, the variable nodes 602(1)-602(n) receive the corresponding channel reliability information $L_1$-$L_n$. The variable node 602(1) receives the channel reliability information $L_1$ of a $1^{st}$ data bit, and the variable node 602(j) receives the channel reliability information $L_j$ of a $j^{th}$ data bit. The error checking and correcting circuit 508 executes a decoding operation according to a structure of the belief propagation graph 610 and the channel reliability information $L_1$-$L_n$.

In the present exemplary embodiment, the decoding operation executed by the error checking and correcting circuit 508 is an iterative decoding operation. In the iterative decoding operation, the variable nodes 602(1)-602(n) calculate reliability information to the check nodes 601(1)-610(k), and the check nodes 601(1)-610(k) also calculate reliability information to the variable nodes 602(1)-602(n). The calculated reliability information can be transmitted along edges in the belief propagation graph 610. For example, the check node 601(i) transmits reliability information $L_{i \to j}$ to the variable node 602(j), and the variable node 602(j) transmits reliability information $L_{j \to i}$ to the check node 601(i). Certain reliability information represents a probability (or the aforementioned confidence level) that a data bit is decoded into bit "1" or "0" that is considered by one node. For example, the reliability information $L_{j \to i}$ represents a confidence level (which can be positive or negative) that the $j^{th}$ data bit is decoded into bit "1" or "0" that is considered by the variable node 602(j), and the reliability information $L_{i \to j}$ represents a confidence level (which can be positive or negative) that the $j^{th}$ data bit is decoded into bit "1" or "0" that is considered by the check node 601(i). The variable nodes 602(1)-602(n) and the check nodes 601(1)-610(k) may calculate output reliability information according to input reliability information, which is equivalent to calculate a condition probability that one data bit is decoded into bit "1" or "0". Therefore, the aforementioned process for transmitting the reliability information is also referred to as belief propagation.

In an exemplary embodiment, the reliability information (for example, the reliability information $L_{i \to j}$ and $L_{j \to i}$) transmitted between the nodes and the channel reliability information (for example, the channel reliability information $L_1$-$L_n$) actually used for decoding the data bits are all represented in Log-Likelihood Ratio (LLR). However, when different algorithms are adopted to update the reliability information and/or the channel reliability information in the iterative decoding operation, the variable nodes 602(1)-602(n) and/or the check nodes 601(1)-610(k) may calculate the reliability information and/or the channel reliability information of different types/attributes. For example, the error checking and correcting circuit 508 may adopt a Sum- Product Algorithm (SPA), a Min-Sum Algorithm or a Bit-Flipping Algorithm, etc., which is not limited by the present disclosure.

In the present exemplary embodiment, the iteration in the iterative decoding operations is repeatedly executed, so as to update (or optimize) the channel reliability information corresponding to at least a part of the data bits. For example, in every iteration of the iterative decoding operation, the variable nodes $602(1)$-$602(n)$ may transmit reliability information to the check nodes $601(1)$-$610(k)$, and the check nodes $601(1)$-$610(k)$ may transmit reliability information to the variable nodes $602(1)$-$602(n)$. In this way, the channel reliability information (for example, the channel reliability information $L_1$-$L_n$) actually used for decoding the data bits may probably be updated in any iteration.

If a codeword generated through certain iteration in the decoding operation is a valid codeword, it represents that the decoding is successful, and the decoding operation would be stopped. If the generated codeword is not the valid codeword, a next iteration would be performed. Moreover, if the total number of times for executing the iteration in certain decoding operation reaches a predetermined threshold value (also referred to as iteration times limit value), it represents that the decoding is failed, and the decoding operation would be also stopped.

In the present exemplary embodiment, the channel reliability information is Log-Likelihood Ratio. In this field, Log-Likelihood Ratio is an input parameter for decoding LDPC code, configured to perform a decoding operation through a LDPC circuit. Furthermore, in this field, methods for updating Log-Likelihood Ratio are optimizing methods such as a Hill Climbing method, a Simulated Annealing method, a Gradient Descent Method, etc.

Log-Likelihood Ratio is widely used for various algorithms of a LDPC circuit, such as Sum-Product Algorithm (SPA), Min-Sum Algorithm, or Bit-Flipping Algorithm, Log-Likelihood Ratio Algorithm, Offset Min-Sum Algorithm, etc. Since those algorithms are well known for the person in the art, the detail description of those algorithms would be omitted.

In the present exemplary embodiment, when uncorrectable error bits existed (or the decoding is fail), the decoding result of a decoding operation may be changed by changing a plurality of Log-Likelihood Ratios used in the iterative decoding operation, such that the foregoing error bits may be corrected (or the decoding may be successful). The foregoing operation of changing the Log-Likelihood Ratios used in the iterative decoding operation also referred to as a perturbation operation.

Moreover, in another exemplary embodiment, the decoding result would be also changed by flipping certain data bits of a codeword (e.g., by using Bit-Flipping Algorithm), and re-performing the iterative decoding operation for the flipped codeword. In some situation, a codeword cannot be decoded (having uncorrectable error bits) before the flipping may be decoded successfully (the originally uncorrectable error bits is corrected successfully) after the flipping. And, in an exemplary embodiment, memory management circuit 502 may continuously perform the iterative decoding operation tile the number of times of the iterative decoding operation reaches a predetermined limit. The manufactures may set the predetermined limit based on the needs of their own, and the invention is not limited thereto. The following will describe the detail of an adaptive protect operation and a perturbation operation used for a LDPC decoder with FIG. 7 and FIG. 8.

Figure 7:
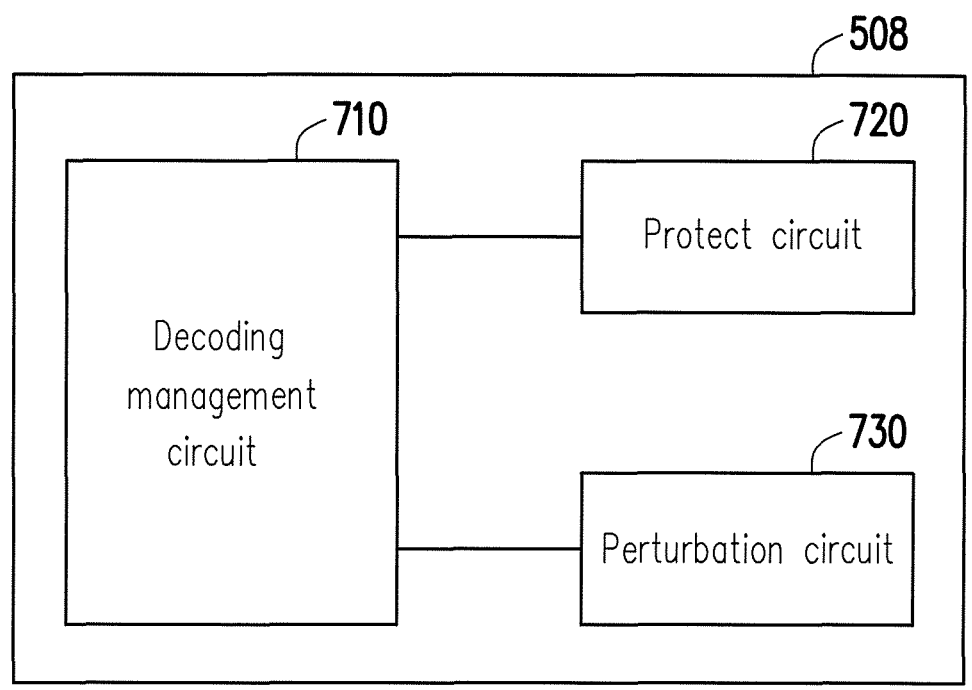
FIG. 7 is a schematic block diagram illustrating the error checking and correcting circuit according to an exemplary embodiment of the present invention.

FIG. 7 is a schematic block diagram illustrating the error checking and correcting circuit according to an exemplary embodiment of the present invention. Referring to FIG. 7, as mentioned before, the error checking and correcting circuit 508 (also referred to as the LDPC encoder/decoder) uses Low-Density Parity-Check code (also referred to as LDPC code hereinafter) to perform the encoding and decoding for data. The error checking and correcting circuit 508 includes a decoding management circuit 710, a protect circuit 720, and a perturbation circuit 730. The decoding management circuit 710 is configured to manage the whole LDPC decoding operation performed by the error checking and correcting circuit 508, and the decoding management circuit 710 may use the LDPC code algorithm for the decoding. The protect circuit 720 coupled to the decoding management circuit 710, configured to select a Log-Likelihood Ratio needed to be protect and perform a protect operation for the selected Log-Likelihood Ratio. The perturbation circuit 730 coupled to the decoding management circuit 710, configured to perform a perturbation operation for Log-Likelihood Ratio(s) not been protected during the LDPC decoding operation. It should be mentioned that, in another exemplary embodiment, the protect circuit 720 or the perturbation circuit 730 may be integrated into the decoding management circuit 710.

Figure 8:
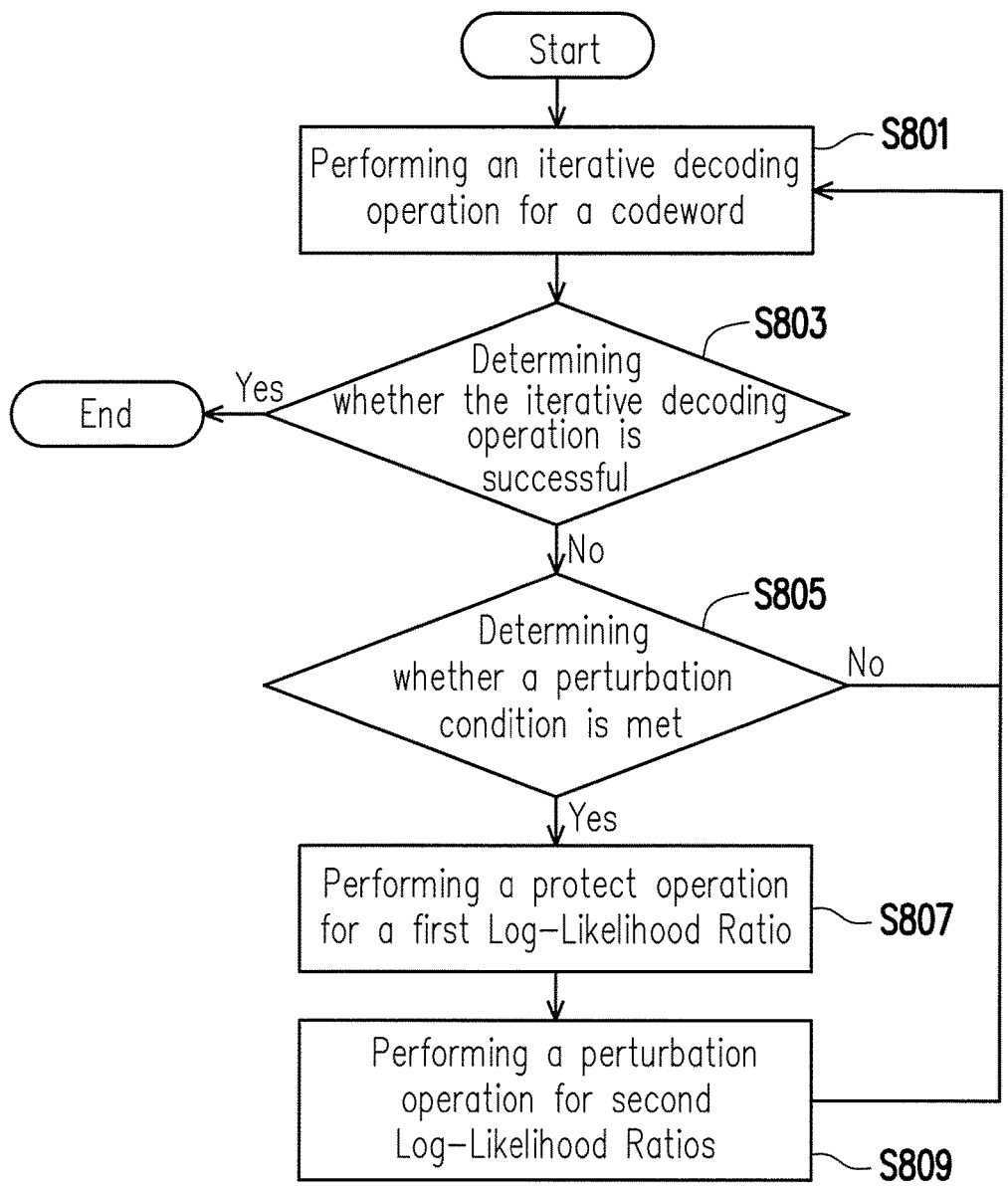
FIG. 8 is a flowchart illustrating a decoding method for the LDPC decoder according to an exemplary embodiment of the present invention.

FIG. 8 is a flowchart illustrating a decoding method for the LDPC decoder according to an exemplary embodiment of the present invention. Please refer to FIG. 7 and FIG. 8, in step S801, the decoding management circuit 710 performs an iterative decoding operation for a codeword. Specifically, the memory management circuit 502 transfer a codeword to be decoded to the decoding management circuit 710 of the error checking and correcting circuit 508 for performing an iterative decoding operation corresponding to LDPC, and then decoding data stored in the rewritable non-volatile memory module 406 corresponding to the said codeword. After receiving the codeword, the decoding management circuit 710 will start to perform an iterative decoding operation for the received codeword, to identify a plurality of data bits of the received codeword, to obtain a corresponding plurality of initial Log-Likelihood Ratios according to the data bits, and to perform the decoding operation via the (initial) Log-Likelihood Ratios. In one example embodiment, the initial Log Likelihood Ratios can be obtained by querying a lookup table. However, in another example embodiment, the initial Log-Likelihood Ratios can be obtained according to threshold voltage distributions of the corresponding memory cells. The present invention is not limited to the methods for obtaining the initial Log-Likelihood Ratios. Upon completion of each iterative decoding operation, the decoding management circuit 710 may count a cumulative number of performing the iterative decoding operations for the codeword.

In step S803, the decoding management circuit 710 determines whether the iterative decoding operation is successful. Specifically, as described above, if codeword generated through this iterative decoding operation is valid, it indicates the decoding operation (result) is successful, and the decoding operation would be stopped, and the whole decoding operation would be ended. If the generated codeword is not a valid codeword, it will continue to step S805. It is should be mentioned that the manufacturers may set iteration times limit value, and amount of the number of performing iterative decoding operations for a codeword would be counted. Thus, when the number of times of the iterative decoding operation for the codeword reaches the iteration times limit, the decoding management circuit 710 may end the decoding operation for the codeword.

In step S805, the decoding management circuit 710 may determine whether a perturbation condition is met. Specifically, the decoding management circuit 710 may determine whether the perturbation condition is met according to a plurality of information (e.g., the number of times of iterative decoding operation) obtained by performing the iterative decoding operation (one or more times).

In the present example embodiment, when the decoding management circuitry 710 determines one of the following situations occurs, the decoding management circuit 710 determine that the perturbation condition is met: (1) If the number of the iterative decoding operation for the codeword exceeds a first threshold value; (2) If the number of times of accessing the column message and/or the Log-Likelihood Ratio is larger than a second threshold value (e.g., Using Min-Sum Algorithm); (3) If the number of times of accessing the row message and/or the Log-Likelihood Ratio is larger than a third threshold value (e.g., Using Bit Flipping Algorithm); (4) If weight of a syndrome is lower than a fourth threshold value (e.g., the decoder is trapped in an error pattern, which results in too low weight of syndrome); (5) If the number of one of the Log-Likelihood Ratios exceeds a fifth threshold value (e.g., when the number of high reliability Log-Likelihood Ratio is larger than a certain value, data may has been saturated); (6) If the amount of the Log-Likelihood Ratios exceeds a sixth threshold value (e.g., when the amount of high reliability Log-Likelihood Ratios is larger than a certain value, data may has been saturated); (7) If the number of times of a syndrome periodically being scaling (e.g., a syndrome may periodically shrink-expand) exceeds a seventh threshold; and (8) If the number of times of a Log-Likelihood Ratio periodically being scaling (e.g., a Log-Likelihood Ratio may periodically shrink-expand) exceeds an eighth threshold.

In more detail, for the above-mentioned situation (7), wherein if the decoding management circuit 710 identifies some syndrome will be updated with the increasing number of times of the iterative decoding operation, and the updated syndrome after each of the iterative decoding operation periodically presents a phenomenon of shrink-expand, the decoding management circuit 710 may determine that the syndrome has been unable to be converged through the current Log-Likelihood Ratio. Thus, the decoding management circuit 710 may determine that the perturbation condition is met, and then a perturbation operation would be performed for a specific Log-Likelihood Ratio in the following steps, such that it would has a chance to get a better result of the decoding (or make the syndrome be converged well).

Similarly, for the above-mentioned situation (8), wherein if the decoding management circuit 710 identifies some Log-Likelihood Ratio will be updated with the increasing number of times of the iterative decoding operation, and the updated Log-Likelihood Ratio after each of the iterative decoding operation periodically presents a phenomenon of shrink-expand, the decoding management circuit 710 may determine that the Log-Likelihood Ratio has been unable to be converged through the current Log-Likelihood Ratio. Thus, the decoding management circuit 710 may determine that the perturbation condition is met, and then a perturbation operation would be performed for a specific Log-Likelihood Ratio in the following steps, such that it would has a chance to get a better result of the decoding. In addition, if in step S805, it is determined that the perturbation condition is not met, it will continue to step S801, to perform the iterative decoding operation for the codeword again (e.g., doing an iteration of the iterative decoding operation again).

After determining that a perturbation condition is met, in step S807, the protect circuit 720 performs a protection operation for a first Log-Likelihood Ratio. Specifically, after determining the perturbation condition is met, the decoding management circuit 710 may select one or more of the Log-Likelihood Ratios corresponding to a plurality of variable nodes as the first Log-Likelihood Ratio, and perform the protect operation for the selected first Log-Likelihood Ratio.

In the present example embodiment, the above-mentioned step of selecting one or more of Log-Likelihood Ratios as the first Log-Likelihood Ratio(s) includes one or a combination of the following ways: (1) Selecting a Log-Likelihood Ratio corresponding to a variable nodes of an unsatisfied syndrome as the first Log-Likelihood Ratio; (2) Selecting a Log-Likelihood Ratio corresponding to a variable node of which the number of times of flipping is larger than a flipping times threshold value as the first Log-Likelihood Ratio (e.g., determining a decoding result generated by the variable node flipped often would be unsuccessful, and guessing the flipping for the variable node is useless); (3) Selecting a Log-Likelihood Ratio corresponding to a variable node not been flipped as the first Log-Likelihood Ratio (e.g., assuming it is under a circumstance without high reliability errors (HRE), guessing a Log-Likelihood Ratio corresponding to a variable node not been flipped would be reliable, and performing a protect operation for the reliable Log-Likelihood Ratio); (4) Selecting a high reliable Log-Likelihood Ratio as the first Log-Likelihood Ratio (e.g., assuming it is under a circumstance without high reliability assuming no errors (HRE), performing a protect operation for the high reliable Log-Likelihood Ratio); and (5) Selecting a Log-Likelihood Ratio corresponding to a low reliable variable nodes as the first Log-Likelihood Ratio (e.g., determining under a circumstance with high reliability error (HRE), performing the protect operation for the low reliable Log-Likelihood Ratio).

It should be noted, in the present exemplary embodiment, if the decoding management circuit 720 performs a protect operation for the first Log-Likelihood Ratio, it indicates that the decoding management circuit would not perform a perturbation operation for the first Log-Likelihood Ratio.

After performing the protect operation for the first Log-Likelihood Ratio, in step S809, the perturbation circuit 730 may perform a perturbation operation for second Log-Likelihood Ratios.

In particular, in the present example embodiment, after selecting a first Log-Likelihood Ratio among the total Log-Likelihood Ratios corresponding to the codeword, the perturbation circuit 730 may treat Log-Likelihood Ratios not been performed the protect operation among all Log-Likelihood Ratios as a second Log-Likelihood Ratios (e.g., other than the first Log-Likelihood Ratio). Namely, at this time, all of the Log-Likelihood Ratios corresponding to the codeword are classified as the first Log-Likelihood Ratio(s) and the second Log-Likelihood Ratio(s), wherein the first Log-Likelihood Ratio is a Log-Likelihood Ratio selected to perform the protect operation, and the second Log-Likelihood Ratio is the other remaining Log-Likelihood Ratio(s) (e.g., other Log-Likelihood Ratio(s) not been selected as the first Log-Likelihood Ratio among all Log-Likelihood Ratios), and a perturbation operation would be performed for the second Log-Likelihood Ratio(s). It should be noted that the present invention is not limited to the number of the first Log-Likelihood Ratio(s) and the second Log-Likelihood Ratio. For example, the number of the first Log-Likelihood Ratio or the second Log-Likelihood Ratio may be equal to or larger than one. However, the amount of the number of the first Log-Likelihood Ratio adding the number of the second Log-Likelihood Ratio would be equal to the number of all Log-Likelihood Ratios corresponding to a codeword.

In the present example embodiment, ways for performing the perturbation operation includes one or combination of the following operations (calculations): (1) Respectively adding a corresponding perturbation value to each of the second Log-Likelihood Ratios, wherein the perturbation value added to each of the second Log-Likelihood Ratios corresponds to the second Log-Likelihood Ratio to which the perturbation value added; (2) Respectively producting the same first value to each of the second Log-Likelihood Ratios; (3) Respectively adding the same second value to each of the second Log-Likelihood Ratios; (4) Setting a second Log-Likelihood Ratio larger than a ninth threshold value among the second Log-Likelihood Ratios to be a third value. It should be noted that the manufacturers may set the first to ninth thresholds according to their own needs.

For example, if the number of the second Log-Likelihood Ratios is "X" (X is a positive integer), a second Log-Likelihood Ratio before being performed the perturbation operation can be expressed as LLR[i] respectively, wherein "i" indicates the order of the likelihood ratios, for example, "i" may be 0, 1, . . . , X-2, X-1. A second Log-Likelihood Ratio after being performed the perturbation operation can be expressed as LLR'[i] respectively, wherein "i" indicates the order of the likelihood ratios, for example, "i" may be 0, 1, . . . , X-2, X-1. Briefly, LLR[i] will become LLR'[i] after being performed the perturbation operation.

According to the foregoing example, the way (1) for performing the perturbation operation may be expressed as a formula (A) below:

$$LLR'[i]=LLR[i]+Noise[i] \quad (A)$$

Wherein, Noise[i] indicates a perturbation value respectively corresponding to different second Log-Likelihood Ratios (e.g., Noise[0] corresponds to LLR[0]). In the present exemplary embodiment, the perturbation value is a random number generated in a manner of Gaussian Random Number or Uniform Random Number. It should be mentioned that, in one exemplary embodiment, if the decoding management circuit 701 determines that the updated (optimized) Log-Likelihood Ratio is trapped in a Local Maximum/Minimum and the Local Maximum/Minimum is not the Global Maximum/Minimum (e.g., the corresponding syndrome is not satisfied), the perturbation circuit 730 may first tries to use the way (1) for performing the perturbation operation.

The way (2) for performing the perturbation operation may be expressed as a formula (B) below:

$$LLR'[i]=\alpha*LLR[i] \quad (B)$$

Wherein $\alpha$ is a constant, and the constant $\alpha$ (also referred to as the first value) may be set by the manufacturers. It should be mentioned that, in one exemplary embodiment, if the decoding management circuit 701 determines that the current iterative operation has problems such as High Reliability Error or Matrix trapping set, the perturbation circuit 730 may first tries to use the way (2) for performing the perturbation operation.

The way (3) for performing the perturbation operation may be expressed as a formula (C) below:

$$LLR'[i]=LLR[i]+\beta \quad (C)$$

Wherein $\beta$ is a constant (can be smaller or larger than zero), and the constant $\beta$ (also referred to as the second value) may be set by the manufacturers. Briefly, it may be regarded as the performed perturbation operation is adding the same "$\beta$" to all the second Log-Likelihood Ratios.

The way (4) for performing the perturbation operation may be expressed as a formula (D) below:

$$LLR'[i]=SIGN(LLR[i])*CONSTANT(if\ LLR[i]>TH) \quad (D)$$

Wherein, "SIGN(LLR[i])" is used for obtaining a sign of "LLR[i]". For example, SIGN(20) may obtain "+1". For another example, SIGN(-20) may obtain "-1". "TH" is a predetermined threshold value (also referred to as ninth threshold value), and "CONSTANT" is a predetermined value (also referred to as third value). Namely, the forgoing formula (D) indicates, for a second Log-Likelihood Ratio larger than a ninth threshold value among the second Log-Likelihood Ratios, make the result by producting a third value to the obtained sign of the second Log-Likelihood Ratio as the perturbed second Log-Likelihood Ratio.

For example, assuming the ninth threshold value is "-20", the third value is "18", and the second Log-Likelihood Ratios are LLR[0] having value "-10" and LLR[1] having value "-25". According to formula (D), the perturbation operation would only performed for LLR[1], and the perturbed Log-Likelihood Ratio LLR' [1] would be "-18" (i.e., "-1"*"18"="-18"). In another exemplary embodiment, the absolute value of the third value is set to be equal to the absolute value of the ninth threshold value.

After finishing step S809, the flow would back to step S801, and the decoding management circuit 710 may perform the iterative decoding operation for the codeword again.

Based on the above, the decoding method provided by the exemplary embodiments of the present invention are capable of performing a protect operation for specific Log-Likelihood Ratio adaptively when a perturbation condition is met, and performing a perturbation operation for the other Log-Likelihood Ratios, to avoid a problem of a syndrome/Log-Likelihood Ratio cannot be converged in the iterative decoding operation, and to strengthen the chances of successfully decoding such that the decoding efficiency and work efficiency are enhanced.

What is claimed is:

1. A decoding method, for a low-density parity-check decoder, comprising:
    performing, by a decoding management circuit of the low-density parity-check decoder, an iterative decoding operation for a codeword, and obtaining, from the performed iterative decoding operation, a syndrome and a plurality of Log-Likelihood Ratios (LLRs) respectively correspond a plurality of data bit values of the codeword;
    determining, by the decoding management circuit, whether the iterative decoding operation is successful;
    in response to determining that the iterative decoding operation is not successful, determining whether, by the decoding management circuit, a perturbation condition is met by determining whether the iterative decoding operation, the syndrome or the plurality of LLRs is not able to be converged;
    determining that the perturbation condition is met when the iterative decoding operation, the syndrome or the plurality of LLRs is determined as not able to be converged, and performing, by a protect circuit, a protect operation for one or more first LLRs among the plurality of LLRs by selecting the one or more first LLRs;

only performing, by a perturbation circuit of the low-density parity-check decoder, a perturbation operation for a plurality of second LLRs among the plurality of LLRs by changing a plurality of values respectively corresponding to the second LLRs, wherein the second LLRs have not been selected in the protect operation; and performing, by the decoding management circuit, a next iterative decoding operation for the codeword with the plurality of LLRs having the protected one or more first LLRs and the value-changed second LLRs after finishing the perturbation operation, so as to make the next iteration operation, the syndrome of the next iterative decoding operation or the plurality of LLRs in the next iterative decoding operation be able to be converged.

2. The decoding method according to claim 1, further comprising:
performing the next iterative decoding operation for the codeword if the perturbation condition is not met.

3. The decoding method according to claim 1, wherein the step of determining whether the perturbation condition is met comprises:
determining the perturbation condition is met if number of performing the iterative decoding operation for the codeword exceeds a first threshold value;
determining the perturbation condition is met if an access times of a column message and/or a LLR exceeds a second threshold value;
determining the perturbation condition is met if an access times of a row message and/or a LLR exceeds a third threshold value;
determining the perturbation condition is met if a weight of the syndrome is lower than a fourth threshold value;
determining the perturbation condition is met if number of a LLR exceeds a fifth threshold value;
determining the perturbation condition is met if an amount of the LLRs exceeds a sixth threshold value;
determining the perturbation condition is met if number of times the syndrome scaled periodically exceeds a seventh threshold value; or
determining the perturbation condition is met if number of times a LLR scaled periodically exceeds an eighth threshold value.

4. The decoding method according to claim 1, wherein the step of performing, by the protect circuit of the low-density parity-check decoder, the protect operation for the one or more first LLRs comprises one or a combination of following operations:
selecting a LLR corresponding to a variable node irrelevant to an unsatisfied syndrome as the first LLR, and protecting the first LLR;
selecting a LLR corresponding to a variable node of which number of flipping is larger than a flip number threshold value as the first LLR, and protecting the first LLR;
selecting a LLR corresponding to a variable node, which has not been flipped, as the first LLR, and protecting the first LLR;
selecting a LLR corresponding to a variable node having high reliability as the first LLR, and protecting the first LLR; and selecting a LLR corresponding to a variable node having low reliability as the first LLR, and protecting the first LLR, wherein the protected first LLR not to be performed the perturbation operation.

5. The decoding method according to claim 4, further comprising:
selecting a plurality of LLRs not the first LLR among the LLRs as the second LLRs, wherein the step of only performing, by the perturbation circuit of the low-density parity-check decoder, the perturbation operation for the second LLRs among the plurality of LLRs by changing the values respectively corresponding to the second LLRs comprises one or a combination of following operations:
respectively adding a corresponding perturbation value to each of the second LLRs, wherein the perturbation value added to each of the second LLRs corresponds to the second LLR to which the perturbation value added;
respectively producting the same first value to each of the second LLRs;
respectively adding the same second value to each of the second LLRs; and
setting a second LLR among the second LLRs to be a third value, wherein the second LLR is larger than a ninth threshold value before being setting to the third value.

6. The decoding method according to claim 5, wherein the perturbation value comprises a Gaussian random number or a uniform random number.

7. The decoding method according to claim 5, wherein the absolute value of the third value is equal to the absolute value of the ninth threshold value.

8. A memory storage apparatus, comprising:
a connection interface unit, configured to couple to a host system; and
a rewritable non-volatile memory module; and
a memory control circuit unit, coupled to the connection interface unit and the rewritable non-volatile memory module,
wherein a decoding management circuit of the memory control circuit unit is configured to perform an iterative decoding operation for a codeword for decoding data stored in the rewritable non-volatile memory module, wherein the codeword corresponds the data, and obtaining, from the performed iterative decoding operation, a syndrome and a plurality of Log-Likelihood Ratios (LLRs) respectively correspond a plurality of data bit values of the codeword;
wherein the decoding management circuit is further configured to determine whether the iterative decoding operation is successful,
wherein, in response to determining that the iterative decoding operation is not successful, the decoding management circuit is further configured to determine whether a perturbation condition is met by determining whether the iterative decoding operation, the syndrome or the plurality of LLRs is not able to be converged,
wherein, the decoding management circuit determines that the perturbation condition is met when the iterative decoding operation, the syndrome or the plurality of LLRs is determined as not able to be converged, and a protect circuit of the memory control circuit unit is configured to perform a protect operation for one or more first LLRs among the plurality of LLRs by selecting the one or more first LLRs,
wherein a perturbation circuit of the memory control circuit unit is configured to perform a perturbation operation for a plurality of second LLRs among the plurality of LLRs by changing a plurality of values respectively corresponding to the second LLRs, wherein the second LLRs have not been selected in the protect operation, wherein the decoding management circuit is further configured to perform a next iterative decoding operation for the codeword after finishing the perturbation operation, so as to make the next iterative decoding operation, the syndrome of the next iterative decoding operation or the plurality of LLRs in the next iterative decoding operation be able to be converged.

9. The memory storage apparatus according to claim 8, wherein the decoding management circuit performs the next iterative decoding operation for the codeword again if the perturbation condition is not met.

10. The memory storage apparatus according to claim 8, wherein in the operation of the decoding management circuit is further configured to determine whether the perturbation condition is met, the decoding management circuit determines the perturbation condition is met if number of performing the iterative decoding operation for the codeword exceeds a first threshold value, wherein the decoding management circuit determines the perturbation condition is met if an access times of a column message and/or a LLR exceeds a second threshold value, wherein the decoding management circuit determines the perturbation condition is met if an access times of a row message and/or a LLR exceeds a third threshold value, wherein the decoding management circuit determines the perturbation condition is met if a weight of the syndrome is lower than a fourth threshold value, wherein the decoding management circuit determines the perturbation condition is met if number of a LLR exceeds a fifth threshold value, wherein the decoding management circuit determines the perturbation condition is met if an amount of the LLRs exceeds a sixth threshold value, wherein the decoding management circuit determines the perturbation condition is met if number of times the syndrome scaled periodically exceeds a seventh threshold value, wherein the decoding management circuit determines the perturbation condition is met if number of times a LLR scaled periodically exceeds an eighth threshold value.

11. The memory storage apparatus according to claim 8, wherein in the operation of the protect circuit is configured to perform the protect operation for the one or more first LLRs comprises one or a combination of following operations:

the protect circuit selects a LLR corresponding to a variable node irrelevant to an unsatisfied syndrome as the first LLR, and protects the first LLR;

the protect circuit selects a LLR corresponding to a variable node of which number of flipping is larger than a flip number threshold value as the first LLR, and protects the first LLR;

the protect circuit selects a LLR corresponding to a variable node, which has not been flipped, as the first LLR, and protects the first LLR;

the protect circuit selects a LLR corresponding to a variable node having high reliability as the first LLR, and protects the first LLR; and the protect circuit selects a LLR corresponding to a variable node having low reliability as the first LLR, and protects the first LLR, wherein the protected first LLR not to be performed the perturbation operation.

12. The memory storage apparatus according to claim 11, the perturbation circuit selects a plurality of LLRs not the first LLR among the LLRs as the second LLRs, wherein in the operation of the perturbation circuit performs the perturbation operation for the second LLRs among the plurality of LLRs by changing the values respectively corresponding to the second LLRs comprises one or a combination of following operations:

the perturbation circuit respectively adds a corresponding perturbation value to each of the second LLRs, wherein the perturbation value added to each of the second LLR corresponds to the second LLR to which the perturbation value added;

the perturbation circuit respectively products the same first value to each of the second LLRs;

the perturbation circuit respectively adds the same second value to each of the second LLRs; and the perturbation circuit sets a second LLR among the second LLRs to be a third value, wherein the second LLR is larger than a ninth threshold value before being setting to the third value.

13. The memory storage apparatus according to claim 12, wherein the perturbation value comprises a Gaussian random number or a uniform random number.

14. The memory storage apparatus according to claim 12, wherein the absolute value of the third value is equal to the absolute value of the ninth threshold value.

15. A memory control circuit unit, for controlling a rewritable non-volatile memory module, comprising:

a host interface, configured to couple to a host system; and a memory interface, configured to couple to the rewritable non-volatile memory module;

an error checking and correcting circuit; and a memory management circuit, coupled to the host interface, the memory interface and the error checking and correcting circuit, wherein the memory management circuit sends a codeword to the error checking and correcting circuit, wherein a decoding management circuit of the error checking and correcting circuit is configured to perform an iterative decoding operation for a codeword for decoding data stored in the rewritable non-volatile memory module, wherein the codeword corresponds the data, and obtaining, from the performed iterative decoding operation, a syndrome and a plurality of Log-Likelihood Ratios (LLRs) respectively correspond a plurality of data bit values of the codeword;

wherein the decoding management circuit is further configured to determine whether the iterative decoding operation is successful, wherein, in response to determining that the iterative decoding operation is not successful, the decoding management circuit is further configured to determine whether a perturbation condition is met by determining whether the iterative decoding operation, the syndrome or the plurality of LLRs is not able to be converged, wherein, the decoding management circuit determines that the perturbation condition is met when the iterative decoding operation, the syndrome or the plurality of LLRs is determined as not able to be converged, and a protect circuit of the error checking and correcting circuit is configured to perform a protect operation for one or more first LLRs among the plurality of LLRs, wherein a perturbation circuit of the error checking and correcting circuit is configured to perform a perturbation operation for a plurality of second LLRs among the plurality of LLRs by changing a plurality of values respectively corresponding to the second LLRs, wherein the second LLRs have not been selected in the protect operation, wherein the decoding management circuit is further configured to perform a next iterative decoding operation for the codeword after finishing the perturbation operation, so as to make the next iterative decoding operation, the syndrome of the next iterative decoding operation or the plurality of LLRs in the next iterative decoding operation be able to be converged.

16. The memory control circuit unit according to claim 15, wherein the decoding management circuit performs the next iterative decoding operation for the codeword again if the perturbation condition is not met.

17. The memory control circuit unit according to claim 15, wherein in the operation of the decoding management circuit is further configured to determine whether the perturbation condition is met, the decoding management circuit determines the perturbation condition is met if number of performing the iterative decoding operation for the codeword exceeds a first threshold value, wherein the decoding management circuit determines the perturbation condition is met if an access times of a column message and/or a LLR exceeds a second threshold value, wherein the decoding management circuit determines the perturbation condition is met if an access times of a row message and/or a LLR exceeds a third threshold value, wherein the decoding management circuit determines the perturbation condition is met if a weight of the syndrome is lower than a fourth threshold value, wherein the decoding management circuit determines the perturbation condition is met if number of a LLR exceeds a fifth threshold value, wherein the decoding management circuit determines the perturbation condition is met if an amount of the LLRs exceeds a sixth threshold value, wherein the decoding management circuit determines the perturbation condition is met if number of times the syndrome scaled periodically exceeds a seventh threshold value, wherein the decoding management circuit determines the perturbation condition is met if number of times a LLR scaled periodically exceeds an eighth threshold value.

18. The memory control circuit unit according to claim 15, wherein in the operation of the protect circuit is configured to perform the protect operation for the one or more first LLRs comprises one or a combination of following operations:

the protect circuit selects a LLR corresponding to a variable node irrelevant to an unsatisfied syndrome as the first LLR, and protects the first LLR;

the protect circuit selects a LLR corresponding to a variable node of which number of flipping is larger than a flip number threshold value as the first LLR, and protects the first LLR;

the protect circuit selects a LLR corresponding to a variable node, which has not been flipped, as the first LLR, and protects the first LLR;

the protect circuit selects a LLR corresponding to a variable node having high reliability as the first LLR, and protects the first LLR; and the protect circuit selects a LLR corresponding to a variable node having low reliability as the first LLR, and protects the first LLR, wherein the protected first LLR not to be performed the perturbation operation.

19. The memory control circuit unit according to claim 18, the perturbation circuit selects a plurality of LLRs not the first LLR among the LLRs as the second LLRs, wherein in the operation of the perturbation circuit performs the perturbation operation for the second LLRs among the plurality of LLRs by changing the values respectively corresponding to the second LLRs comprises one or a combination of following operations:

the perturbation circuit respectively adds a corresponding perturbation value to each of the second LLRs, wherein the perturbation value added to each of the second LLR corresponds to the second LLR to which the perturbation value added;

the perturbation circuit respectively products the same first value to each of the second LLRs;

the perturbation circuit respectively adds the same second value to each of the second LLRs; and the perturbation circuit sets a second LLR among the second LLRs to be a third value, wherein the second LLR is larger than a ninth threshold value before being setting to the third value.

20. The memory control circuit unit according to claim 19, wherein the perturbation value comprises a Gaussian random number or a uniform random number.

21. The memory control circuit unit according to claim 19, wherein the absolute value of the third value is equal to the absolute value of the ninth threshold value.

* * * * *